(12) United States Patent
Imaizumi (10) Patent No.: US 9,467,163 B1
(45) Date of Patent: Oct. 11, 2016

(54) POWER REDUCTION IN DELTA SIGMA MODULATOR

(71) Applicant: SII Semiconductor Corporation, Chiba-shi, Chiba (JP)

(72) Inventor: Eiki Imaizumi, Chiba (JP)

(73) Assignee: SII Semiconductor Corporation, Chiba (JP)

( * ) Notice: Subject to any disclaimer, the term of this patent is extended or adjusted under 35 U.S.C. 154(b) by 0 days.

(21) Appl. No.: 15/079,556

(22) Filed: Mar. 24, 2016

(30) Foreign Application Priority Data

Mar. 25, 2015 (JP) .................. 2015-062833

(51) Int. Cl.
*H03M 3/00* (2006.01)

(52) U.S. Cl.
CPC ............... *H03M 3/32* (2013.01); *H03M 3/422* (2013.01); *H03M 3/458* (2013.01)

(58) Field of Classification Search
CPC .......... H03M 3/43; H03M 3/37; H03M 3/45; H03M 3/39; H03M 3/30; H03M 3/32; H03M 3/438; H03M 3/368; H03M 3/452; H03M 3/428; H03M 3/496; H03M 3/446; H03M 3/422; H03M 3/458
USPC ......................................................... 341/143
See application file for complete search history.

(56) References Cited

U.S. PATENT DOCUMENTS

| | | | | |
|---|---|---|---|---|
| 5,757,300 A * | 5/1998 | Koilpillai | ............... | H03M 3/456 341/143 |
| 6,617,908 B1 * | 9/2003 | Thomsen | ................ | H03F 3/005 327/337 |
| 6,765,520 B1 * | 7/2004 | Chuang | ................ | H03M 3/364 341/143 |
| 6,954,159 B1 * | 10/2005 | Cooper | ................ | H03M 3/368 341/143 |
| 6,956,514 B1 * | 10/2005 | Melanson | ............. | H03M 3/368 341/143 |
| 7,167,119 B1 * | 1/2007 | Lei | ......... | H03M 3/342 341/143 |
| 7,379,002 B1 * | 5/2008 | Zhixu | ................... | H03M 3/392 341/143 |
| 7,671,776 B1 * | 3/2010 | Rangan | ................ | H03M 3/376 341/144 |
| 8,643,524 B1 * | 2/2014 | Zanbaghi | ............. | H03M 3/322 341/143 |
| 8,907,829 B1 * | 12/2014 | Naderi | .................. | H03M 3/496 341/143 |
| 9,184,765 B1 * | 11/2015 | Wang | .................... | H03M 3/322 |
| 9,332,345 B1 * | 5/2016 | Melanson | ............ | H03M 3/412 |
| 2007/0247341 A1 * | 10/2007 | Liu | ......... | H03M 3/32 341/143 |
| 2008/0074303 A1 * | 3/2008 | Rueger | ................... | H03M 3/39 341/143 |
| 2008/0150777 A1 * | 6/2008 | Rangan | ................. | H03M 3/428 341/143 |

(Continued)

OTHER PUBLICATIONS

Markus, J. et al., "Theory and Applications of Incremental ΔΣ Converters", *IEEE Transactions on Circuits and Systems-I: Regular Papers*, vol. 51, No. 4, Apr. 2004, pp. 678-690.

(Continued)

*Primary Examiner* — Lam T Mai
(74) *Attorney, Agent, or Firm* — Brinks Gilson & Lione (57) ABSTRACT

A high-order delta-sigma modulator is realized with amplifying/integrating circuits each having a small circuit scale, to thereby provide a small-size and low-power consumption delta-sigma modulator having a high precision. The delta-sigma modulator including the amplifying/integrating circuits connected in series in a plurality of stages has a delta-sigma modulator configuration in which one of adjacent amplifying/integrating circuits includes a delay integrating circuit and another thereof includes a non-delay integrating circuit. In an actual circuit, one amplifying circuit is operated in a time division manner to be shared between the adjacent amplifying/integrating circuits. The circuit scale is reduced in this way.

7 Claims, 10 Drawing Sheets

(56) References Cited

U.S. PATENT DOCUMENTS

2011/0095924 A1* 4/2011 Lee ............... H03M 3/356
 341/143
2014/0368365 A1* 12/2014 Quiquempoix ....... H03M 3/496
 341/143

OTHER PUBLICATIONS

Quiquempoix, V. et al., "A Low-Power 22-bit Incremental ADC with 4 ppm INL, 2 ppm Gain Error and 2 μV DC Offset", *Proceedings of ESSCIRC*, Grenoble, France, 2005, pp. 443-446.

* cited by examiner

POWER REDUCTION IN DELTA SIGMA MODULATOR

RELATED APPLICATIONS

This application claims priority under 35 U.S.C. §119 to Japanese Patent Application No. 2015-062833 filed on Mar. 25, 2015, the entire content of which is hereby incorporated by reference.

BACKGROUND OF THE INVENTION

1. Field of the Invention

The present invention relates to an over sampling analog-to-digital converter, and more particularly, to a high-order delta-sigma modulator.

2. Description of the Related Art

Analog-to-digital converters include Nyquist analog-to-digital converters and over sampling analog-to-digital converters. For measurement in a relatively narrow signal band, there has been used an over sampling analog-to-digital converter, a precision of which is easily increased and which has a small circuit scale. In particular, a delta-sigma modulator, which is a type of the over sampling analog-to-digital converter, has often been used.

The analog-to-digital converter includes a delta-sigma modulator including: amplifying/integrating circuits in a plurality of stages, each of which is configured to amplify and integrate a differential signal between an input analog signal and an expected feedback analog signal; a quantizer configured to convert an output of the amplifying/integrating circuit into a digital value; and a digital/analog converter configured to generate the feedback analog signal with the digital value, and a digital filter that includes, for example, a decimation filter and is configured to calculate a final analog/digital converted value based on a numerical sequence of digital values output from the delta-sigma modulator.

The precision of the analog-to-digital converter employing this system depends on the configuration of a delta-sigma modulator, and hence, in order to realize the high precision, a delta-sigma modulator is used that includes amplifying/integrating circuits connected in series in a plurality of stages. As the number of stages of the amplifying/integrating circuits is increased, the precision is improved and the circuit scale and the power consumption are increased.

In terms of the circuit scale and the power consumption, the number of stages needs to be small, but the number of stages of the differential amplifying/integrating circuits needs to be increased for the higher precision. Thus, a delta-sigma modulator having a small circuit scale is needed.

Figure 8:
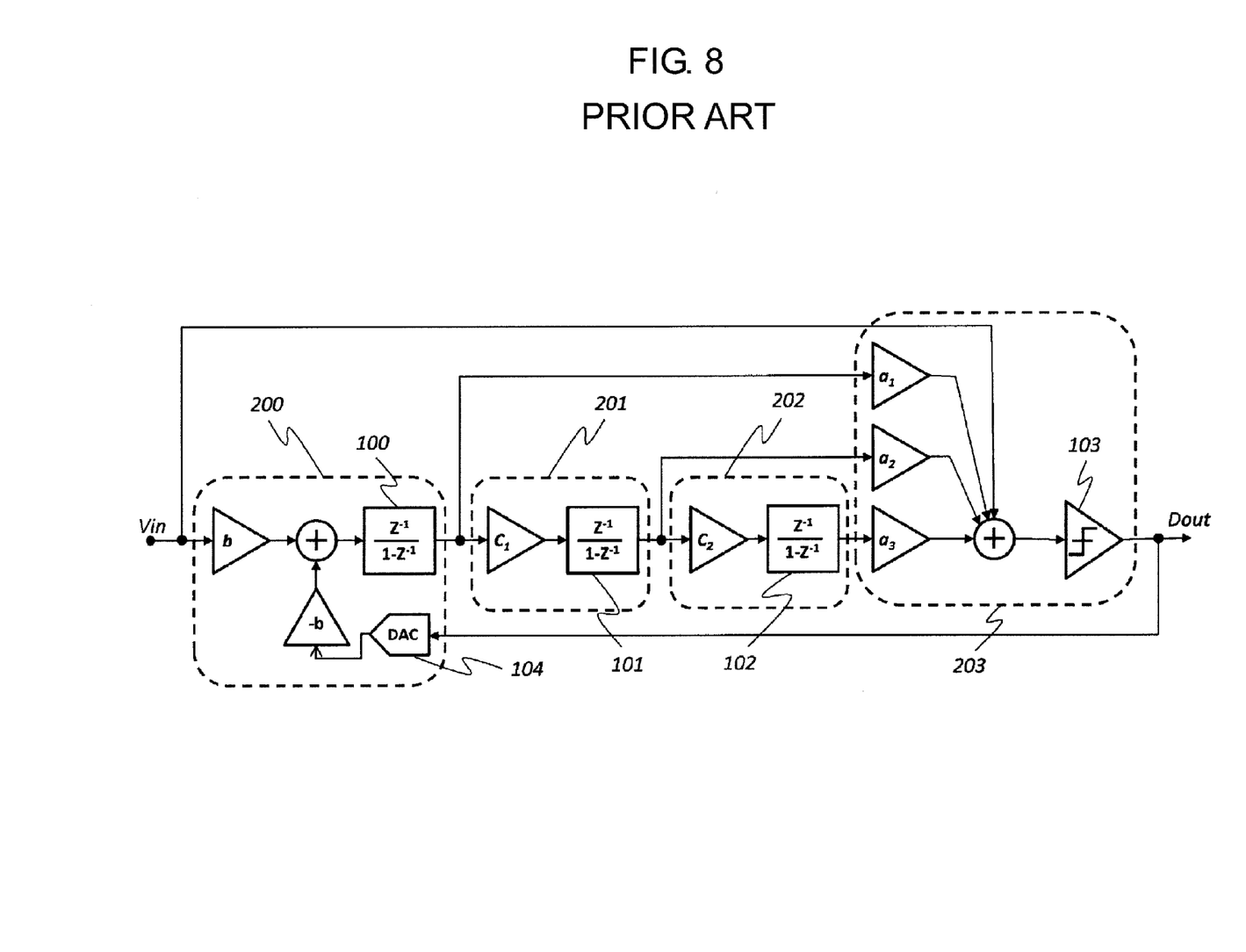
FIG. 8 is a functional diagram for illustrating the configuration of a related-art third-order delta-sigma modulator.

FIG. 8 is an illustration of an example of a delta-sigma modulator of related-art delta-sigma modulators.

The related-art delta-sigma modulator is a third-order delta-sigma modulator including a differential amplifying/integrating circuit 200, amplifying/integrating circuits 201 and 202, and a quantizer 203.

The differential amplifying/integrating circuit 200 in a first stage includes an amplifier configured to amplify (b times) an input signal Vin, a digital/analog converter 104 configured to convert an output Dout of the quantizer 203 into an analog signal, an amplifier configured to amplify (−b times) an analog signal, an adder circuit configured to add together output signals of the two amplifiers, and an integrating circuit 100 configured to integrate an output of the adder circuit.

The amplifying/integrating circuit 201 in a second stage includes an amplifier configured to amplify (c1 times) an output of the differential amplifying/integrating circuit 200, and an integrating circuit 101 configured to integrate an output of the amplifier.

The amplifying/integrating circuit 202 in a third stage includes an amplifier configured to amplify (c2 times) an output of the amplifying/integrating circuit 201 in the second stage, and an integrating circuit 102 configured to integrate an output of the amplifier.

The quantizer 203 includes an adder configured to add together the input signal Vin, an amplified (a1 times) signal of an output of the differential amplifying/integrating circuit 200 in the first stage, an amplified (a2 times) signal of an output of the amplifying/integrating circuit 201 in the second stage, and an amplified (a3 times) signal of an output of the amplifying/integrating circuit 202 in the third stage, and a comparator 103 configured to compare the added signal to an expected reference voltage.

A signal transfer function STF(z) and a noise transfer function NTF(z) of the related-art third-order delta-sigma modulator are represented by the following expressions, respectively.

$$STF(z)=1$$

$$NTF(z)=(z-1)^3/\{(z-1)^3+b \cdot a1 \cdot (z-1)^2+b \cdot a2 \cdot c1 \cdot (z-1)+b \cdot a3 \cdot c2 \cdot c1\}$$

A signal component is passed through as it is. However, delay integrating circuits are provided in the three stages, and hence a quantization noise is shifted to a high frequency side with the third-order characteristic of z. Note that, the signals are transferred with three clock delay.

Figure 9:
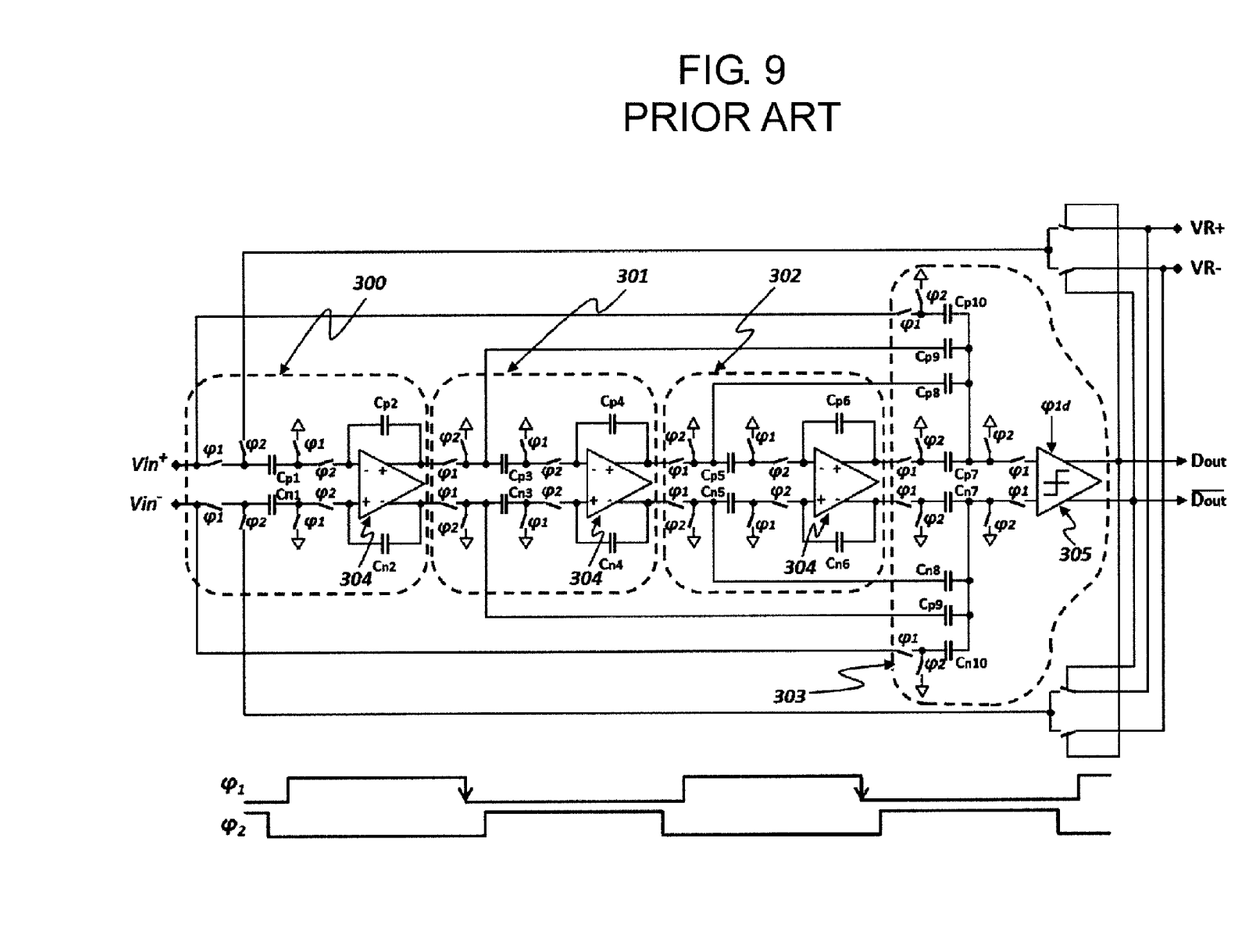
FIG. 9 is a circuit diagram for illustrating an example of the related-art third-order delta-sigma modulator.

FIG. 9 is a circuit diagram for illustrating an example of the related-art third-order delta-sigma modulator. In the example of FIG. 9, input signals are differential signals (Vin+ and Vin−).

The related-art third-order delta-sigma modulator includes switched capacitor amplifiers 300, 301, and 302, and a quantizer 303. The switched capacitor amplifiers 300, 301, and 302 can integrally realize an amplifying function and an integrating function. The quantizer 303 includes a capacitor configured to sample a signal or a reference signal, and a comparator 305 configured to compare a signal input thereto via the capacitor to an expected reference voltage. Each of the switched capacitor amplifiers 300, 301, and 302 performs (a) signal sampling/previous signal holding operation and (b) amplifying/integrating operation at the same timing.

Figure 10:
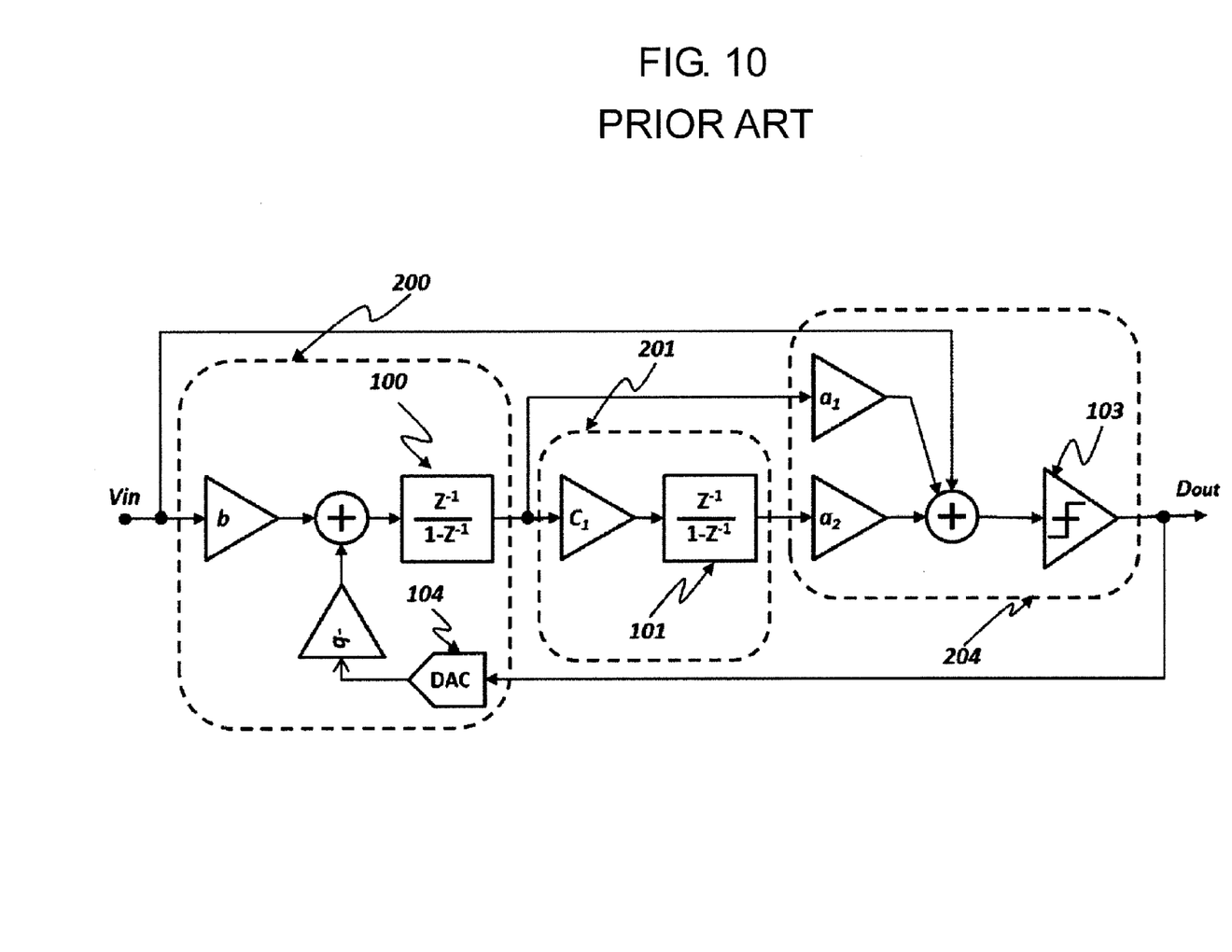
FIG. 10 is a functional diagram for illustrating the configuration of a related-art second-order delta-sigma modulator.

FIG. 10 is a functional diagram of a related-art second-order delta-sigma modulator including amplifying/integrating circuits in two stages. A signal transfer function STF(z) and a noise transfer function NTF(z) of the second-order delta-sigma modulator are represented by the following expressions, respectively.

$$STF(z)=1$$

$$NTF(z)=(z-1)^2/\{(z-1)^2+b \cdot a1 \cdot (z-1)+b \cdot a2 \cdot c1\}$$

The signal transfer function STF(z) and an exhibited characteristic for a signal component are the same as those of the third-order delta-sigma modulator. The number of amplifying/integrating circuits is smaller than the third-order delta-sigma modulator by one stage, and hence a quantization noise is shifted to a high frequency side with the second-order characteristic of z.

However, in the related-art delta-sigma modulator, the number of differential amplifiers, which are necessary for holding and amplifying/integrating signals, needs to be the same as that of stages of the switched capacitor amplifiers. That is, three differential amplifiers are needed in the third-order delta-sigma modulator, and two differential amplifiers are needed in the second-order delta-sigma modulator.

The related-art delta-sigma modulator needs as many differential amplifiers as stages of the amplifying/integrating circuits, and hence it is difficult to reduce the circuit scale and the power consumption.

SUMMARY OF THE INVENTION

The present invention has been conceived in order to solve the problems described above, and provides a delta-sigma modulator capable of reducing its circuit scale and power consumption.

In order to solve the related-art problems, a delta-sigma modulator according to one embodiment of the present invention has the following configuration.

The delta-sigma modulator includes: a first amplifying/integrating circuit configured to integrate a difference between an analog input signal and a feedback analog signal, to thereby output the integrated signal; N amplifying/integrating circuit(s) (N is an integer equal to or larger than 1), which is (are) configured to integrate the integrated signal input thereto to output the integrated signal, and is (are) connected in series to the first amplifying/integrating circuit; and a quantizer configured to compare a magnitude of an expected reference signal and a magnitude of a signal obtained by adding together the analog input signal and signals obtained by amplifying the integrated signals of the first amplifying/integrating circuit and the amplifying/integrating circuit by expected gains, respectively, and to output a digital value. The adjacent amplifying/integrating circuits include a delay integrating circuit and a non-delay integrating circuit, respectively.

According to the delta-sigma modulator of the one embodiment of the present invention, the delta-sigma modulator includes the amplifying/integrating circuits in the plurality of stages, and the adjacent integrating circuits include the delay integrating circuit and the non-delay integrating circuit, respectively, to thereby realize the amplifying/integrating circuits in the two stages with one amplifying circuit. Thus, the circuit scale and the power consumption may be reduced. In short, a small and low-power consumption analog-to-digital converter may be provided.

In addition, a clock delay of the signal may be reduced, and hence the stability of the delta-sigma modulator may be enhanced.

DETAILED DESCRIPTION OF THE PREFERRED EMBODIMENTS

Figure 1:
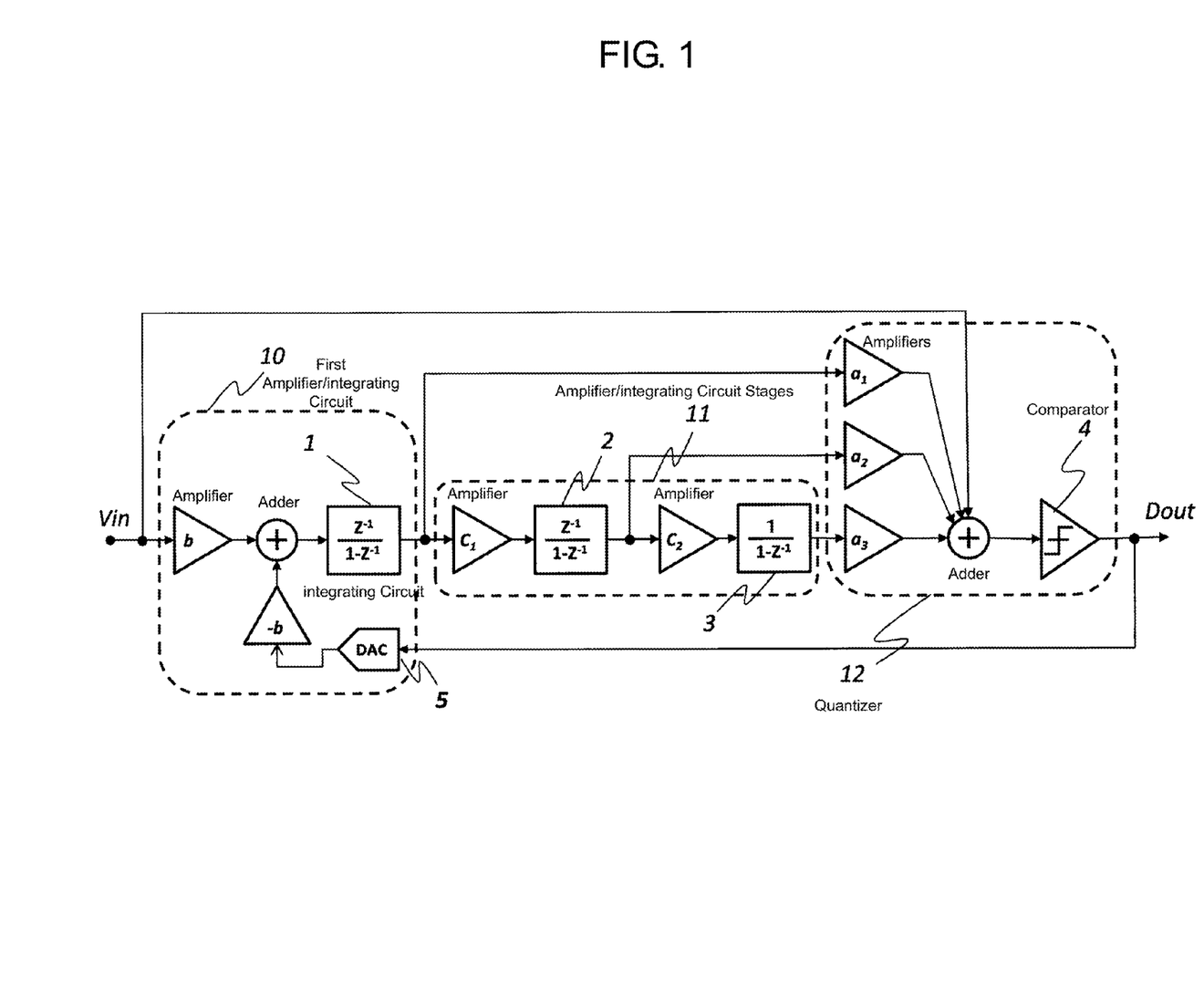
FIG. 1 is a functional diagram for illustrating the configuration of a third-order delta-sigma modulator according to an embodiment of the present invention.

FIG. 1 is a functional diagram for illustrating the configuration of a third-order delta-sigma modulator according to an embodiment of the present invention.

The third-order delta-sigma modulator of this embodiment includes a differential amplifying/integrating circuit 10 in a first stage, amplifying/integrating circuits 11 in second and third stages, and a quantizer 12.

The differential amplifying/integrating circuit 10 in the first stage includes an amplifier configured to amplify (b times) an input signal Vin, a digital/analog converter 5 configured to convert an output Dout of the quantizer 12 into an analog signal, an amplifier configured to amplify (−b times) the analog signal, an adder circuit configured to add together output signals of the two amplifiers, and an integrating circuit 1 configured to integrate an output of the adder circuit.

The amplifying/integrating circuits 11 in the second and third stages each include an amplifier configured to amplify (c1 times) an output of the differential amplifying/integrating circuit 10, an integrating circuit 2 configured to integrate an output of the amplifier, an amplifier configured to amplify (c2 times) an output of the integrating circuit 2, and an integrating circuit 3 configured to integrate an output of the amplifier.

The quantizer 12 includes an adder configured to add together the input signal Vin, an amplified (a1 times) signal of the output of the differential amplifying/integrating circuit 10 in the first stage, an amplified (a2 times) signal of the output of each of the integrating circuits 2 in the second and third stages, and an amplified (a3 times) signal of an output of the integrating circuit 3, and a comparator 4 configured to compare the added signal to an expected reference voltage.

A signal transfer function STF(z) and a noise transfer function NTF(z) of the third-order delta-sigma modulator of this embodiment are expressed by the following expressions, respectively.

STF(z)=1

NTF(z)=(z−1)$^3$/{(z−1)$^3$+b·a1·(z−1)$^2$+b·a2·c1·(z−1)+ b·a3·c2·c1·z}

The signal transfer function STF(z) is the same as that of the related-art third-order delta-sigma modulator. The noise transfer function NTF(z) differs from that of the related-art third-order delta-sigma modulator in the fourth term of the denominator. The delay is smaller than that of the related-art third-order delta-sigma modulator by one clock, and hence the fourth term of the denominator is multiplied by a variable z in the noise transfer function NTF(z) of the third-order delta-sigma modulator of this embodiment. However, the denominator of the noise transfer function NTF(z) of the third-order delta-sigma modulator of this embodiment is a third-order polynomial expression with the variable z. Thus, noise transfer characteristics similar to those of the related-art third-order delta-sigma modulator can be realized through adjustment of b, c1, c2, a1, a2, and a3, which are gain parameters.

Figure 2:
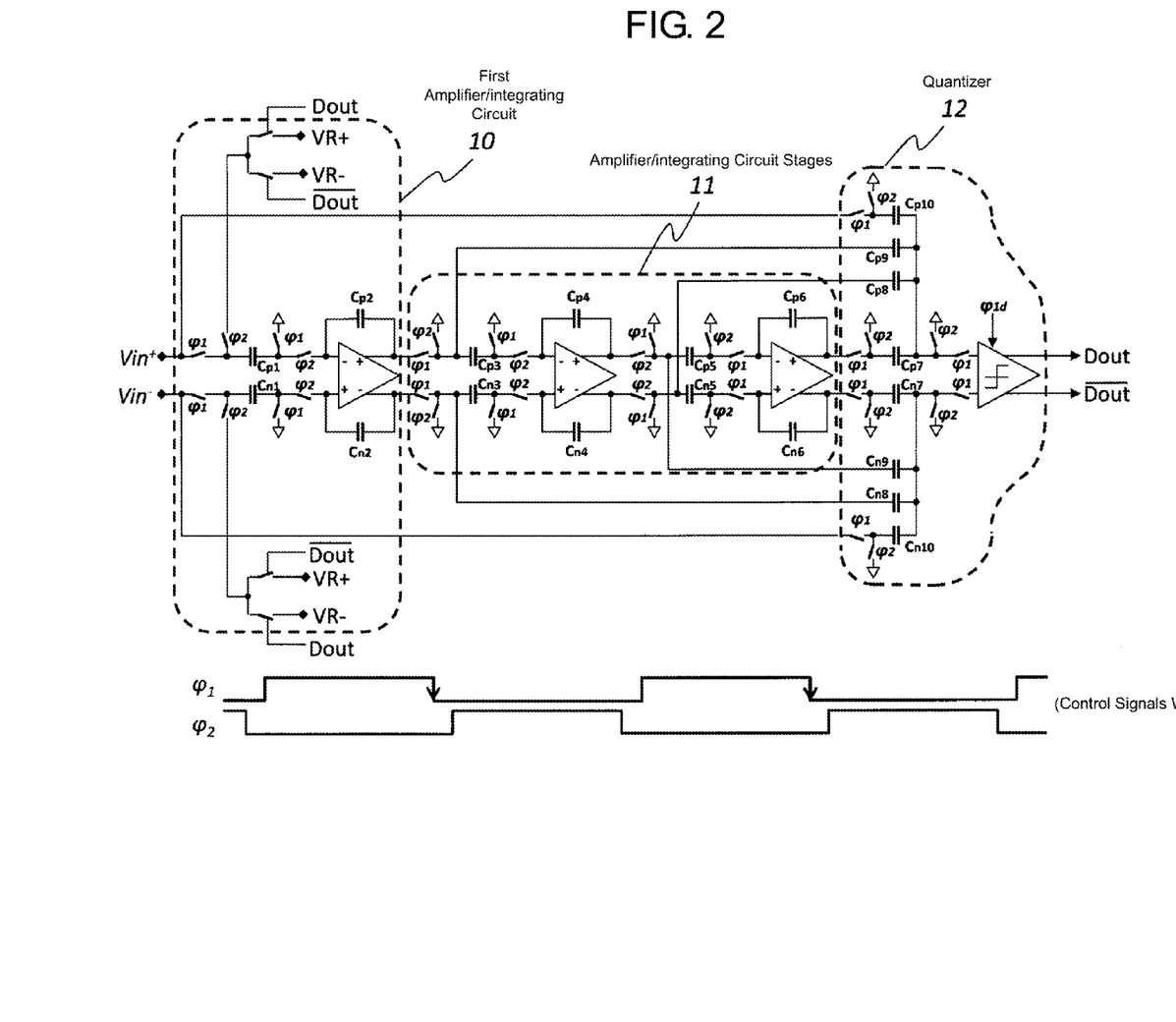
FIG. 2 is a circuit diagram for illustrating an example of the circuit configuration of the third-order delta-sigma modulator of this embodiment.

FIG. 2 is a circuit diagram for illustrating an example of the circuit configuration of the third-order delta-sigma modulator of this embodiment. In the circuit example of FIG. 2, input signals are the differential signals (Vin+ and Vin−). A voltage VR+ and a voltage VR− are reference voltages of the digital/analog converter 5. Control signals $\Phi_1$ and $\Phi_2$ of respective switches have waveforms as illustrated in FIG. 2, for example.

In this case, the amplifying/integrating circuits in the second and third stages have configurations illustrated in FIG. 2, and each serve as a switched capacitor amplifier having a half clock delay. In the third-order delta-sigma modulator of FIG. 2, one clock delay is provided by the amplifying/integrating circuits in the second and third stages, and hence the delay is smaller than that of the related-art third-order delta-sigma modulator by one clock.

Figure 3:
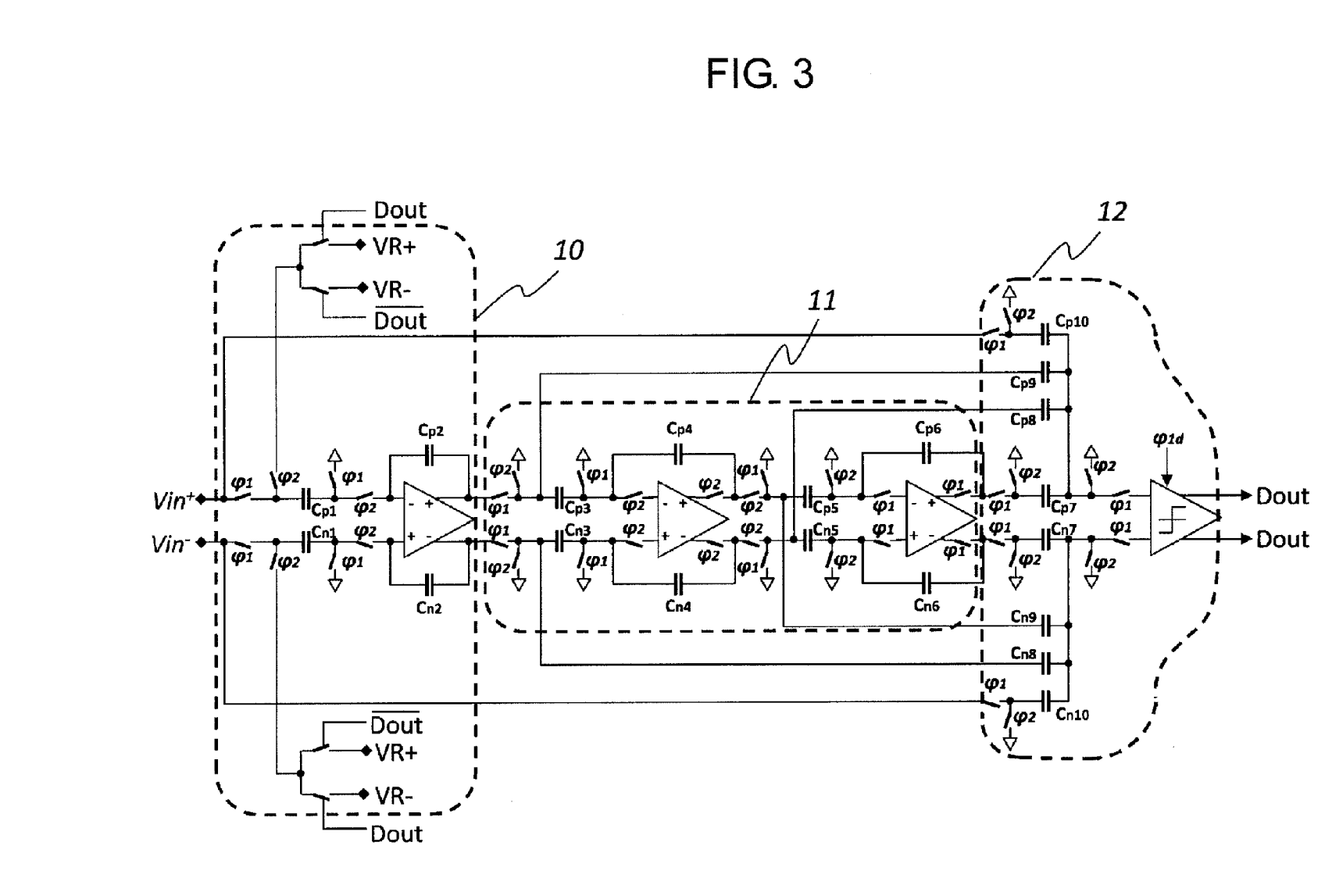
FIG. 3 is a circuit diagram for illustrating an example of the circuit configuration of the third-order delta-sigma modulator of this embodiment.

FIG. 3 is an illustration of a modified example of the circuit of FIG. 2. In the third-order delta-sigma modulator of FIG. 3, the switched capacitor amplifiers in the second and third stages are connected in a different switch connection manner. Feedback capacitors Cp4, Cn4, Cp6, and Cn6 of the switched capacitor amplifiers in the second and third stages of FIG. 2 are each connected to an input and an output of a fully-differential amplifier. In the second and third stages of FIG. 3, the feedback capacitors Cp4 and Cn4 are connected to the input and the output of the fully-differential amplifier via switches that are controlled by the control signal $\Phi_2$, and the feedback capacitors Cp6 and Cn6 are connected to the input and the output of the fully-differential amplifier via switches that are controlled by the control signal $\Phi_1$.

When attention is paid to the switched capacitor amplifiers in the second and third stages of FIG. 3, the following are found. Specifically, in the switched capacitor amplifier in the second stage, the switches are closed with a clock φ2 being "High" and the feedback capacitors Cp4 and Cn4 are connected to the input and output terminals of the fully-differential amplifier. On the other hand, in the switched capacitor amplifier in the third stage in this case, the switches are opened with a clock φ1 being "Low" and the feedback capacitors Cp6 and Cn6 are disconnected from the input and output terminals of the fully-differential amplifier. When the clock φ2 is "Low" and the clock φ1 is "High", the feedback capacitors in the switched capacitor amplifier in the second stage are disconnected from the fully-differential amplifier, whereas the feedback capacitors in the switched capacitor amplifier in the third stage are connected to the input and output terminals of the fully-differential amplifier. This means that the fully-differential amplifier in the third stage is not used when the fully-differential amplifier in the second stage operates, and conversely, the fully-differential amplifier in the third stage is used when the fully-differential amplifier in the second stage is not used. This means that the fully-differential amplifiers are not simultaneously used in the second stage and in the third stage, and hence a fully-differential amplifier can be shared between the second stage and the third stage.

Figure 4:
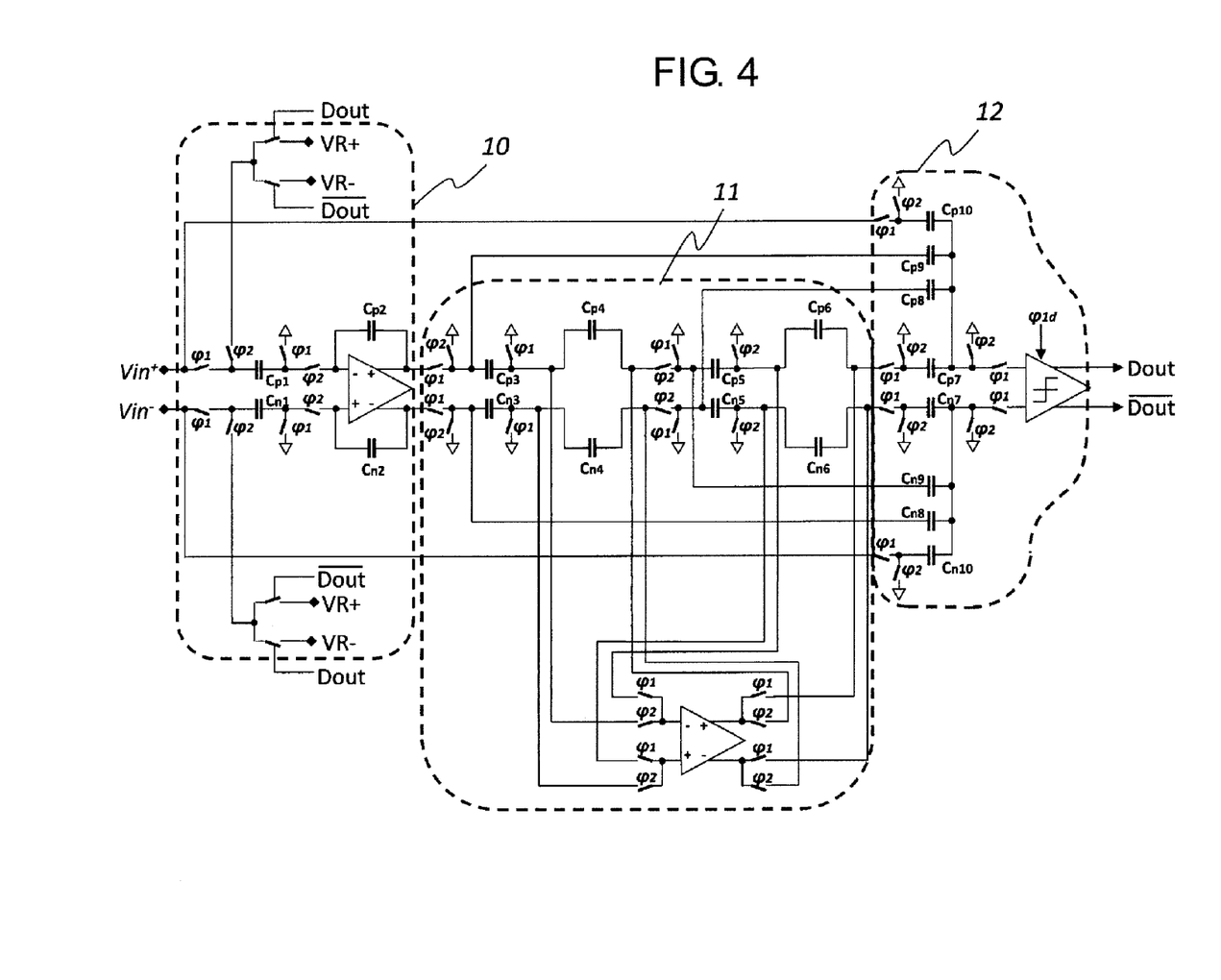
FIG. 4 is a circuit diagram for illustrating an example of the circuit configuration of the third-order delta-sigma modulator of this embodiment.

FIG. 4 is an illustration of a circuit example of the third-order delta-sigma modulator in which a fully-differential amplifier is shared between the second stage and the third stage. When the third-order delta-sigma modulator has the configuration as described above, the used fully-differential amplifiers are two, and hence the circuit scale and the power consumption can be reduced.

Further, in the third-order delta-sigma modulator of this embodiment, the delay is set to be smaller than that of the related-art third-order delta-sigma modulator by one clock, thereby providing an effect that the operation is stable.

Note that, although the third-order delta-sigma modulator of this embodiment is described with the circuit example in which the fully-differential amplifier is shared between the second stage and the third stage, the fully-differential amplifier may be shared between the first stage and the second stage.

Figure 5:
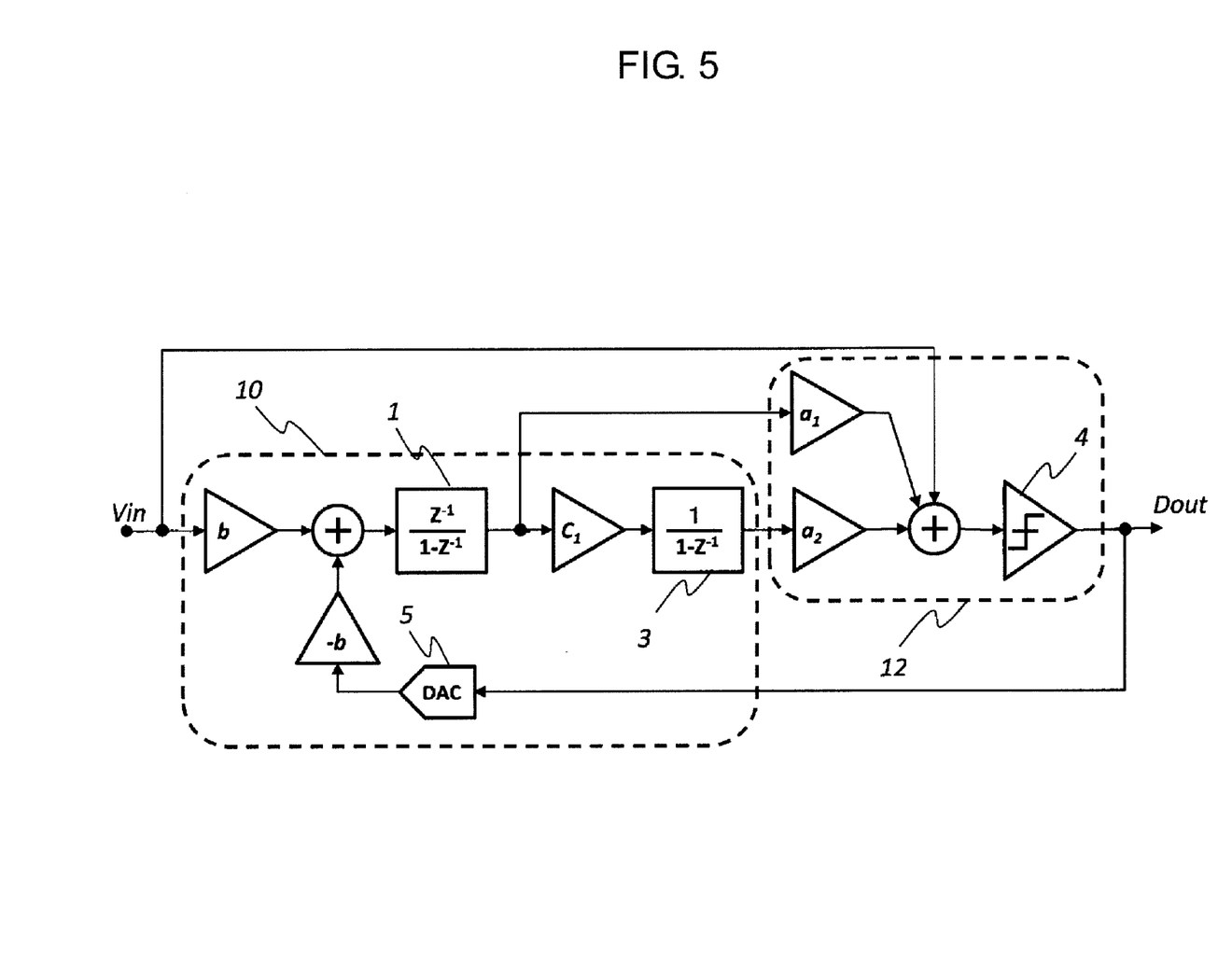
FIG. 5 is a functional diagram for illustrating the configuration of a second-order delta-sigma modulator of this embodiment.

FIG. 5 is a functional diagram for illustrating the configuration of a second-order delta-sigma modulator of this embodiment.

The second-order delta-sigma modulator of this embodiment includes a differential amplifying/integrating circuit in the first stage and an amplifying/integrating circuit in the second stage, which are collectively denoted as 10, and a quantizer 12.

The second-order delta-sigma modulator of this embodiment includes, similarly to the third-order delta-sigma modulator of this embodiment, a non-delay integrating circuit as the integrating circuit in the second stage. A signal transfer function STF(z) and a noise transfer function NTF(z) of the second-order delta-sigma modulator of this embodiment are expressed by the following expressions, respectively.

$$STF(z)=1$$

$$NTF(z)=(z-1)^2/\{(z-1)^2+b\cdot a1\cdot(z-1)+b\cdot a2\cdot c1\cdot z\}$$

The signal transfer function STF(z) is the same as that of the related-art second-order delta-sigma modulator. The delay is smaller than that of the related-art second-order delta-sigma modulator by one clock, and hence the third term of the denominator is multiplied by a variable z in the noise transfer function NTF(z) of the second-order delta-sigma modulator of this embodiment. However, the denominator of the noise transfer function NTF(z) of the second-order delta-sigma modulator of this embodiment and that of the related-art second-order delta-sigma modulator are both second-order polynomial expressions with the variable z. Thus, characteristic functions similar to those of the related-art second-order delta-sigma modulator can be obtained through adjustment of b, c1, a1, and a2, which are gain parameters.

Figure 6:
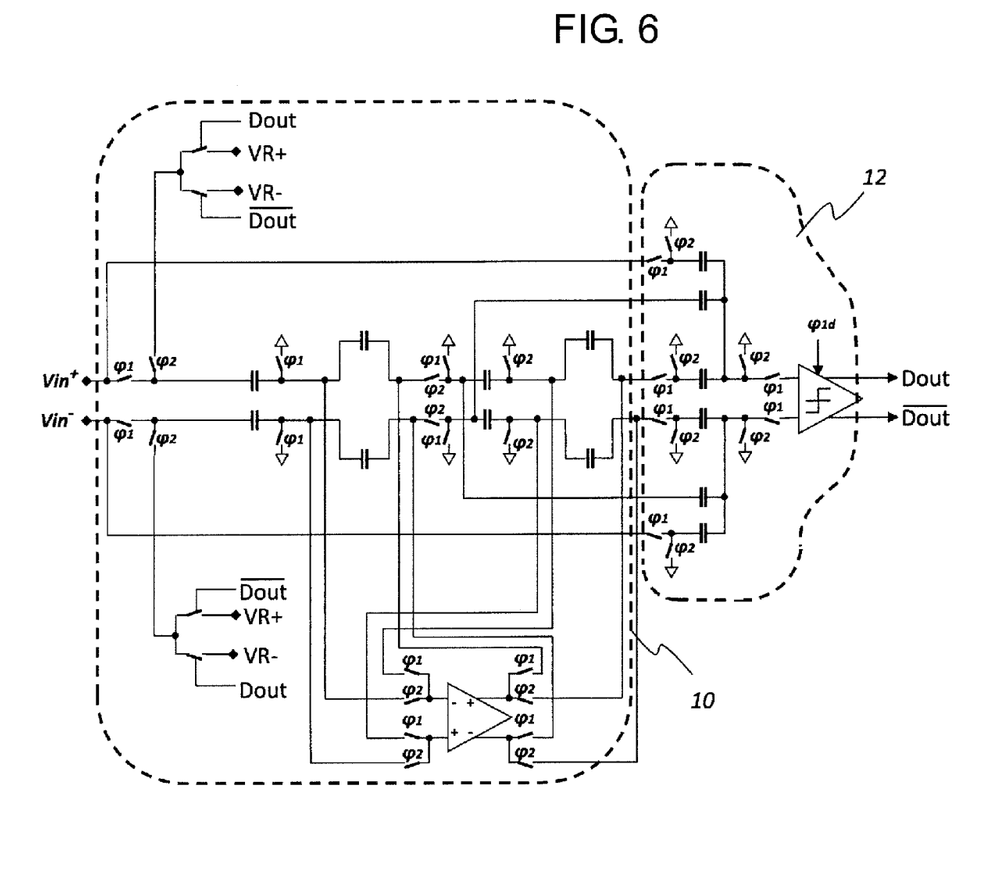
FIG. 6 is a circuit diagram for illustrating an example of the circuit configuration of the second-order delta-sigma modulator of this embodiment.

FIG. 6 is an illustration of a circuit example of the second-order delta-sigma modulator in which a fully-differential amplifier is shared between the first stage and the second stage. When the second-order delta-sigma modulator has the configuration as described above, the used fully-differential amplifier is one, and hence the circuit scale and the power consumption can be reduced.

Further, in the second-order delta-sigma modulator of this embodiment, the delay is set to be smaller than that of the related-art second-order delta-sigma modulator by one clock, thereby providing an effect that the operation is stable.

Figure 7:
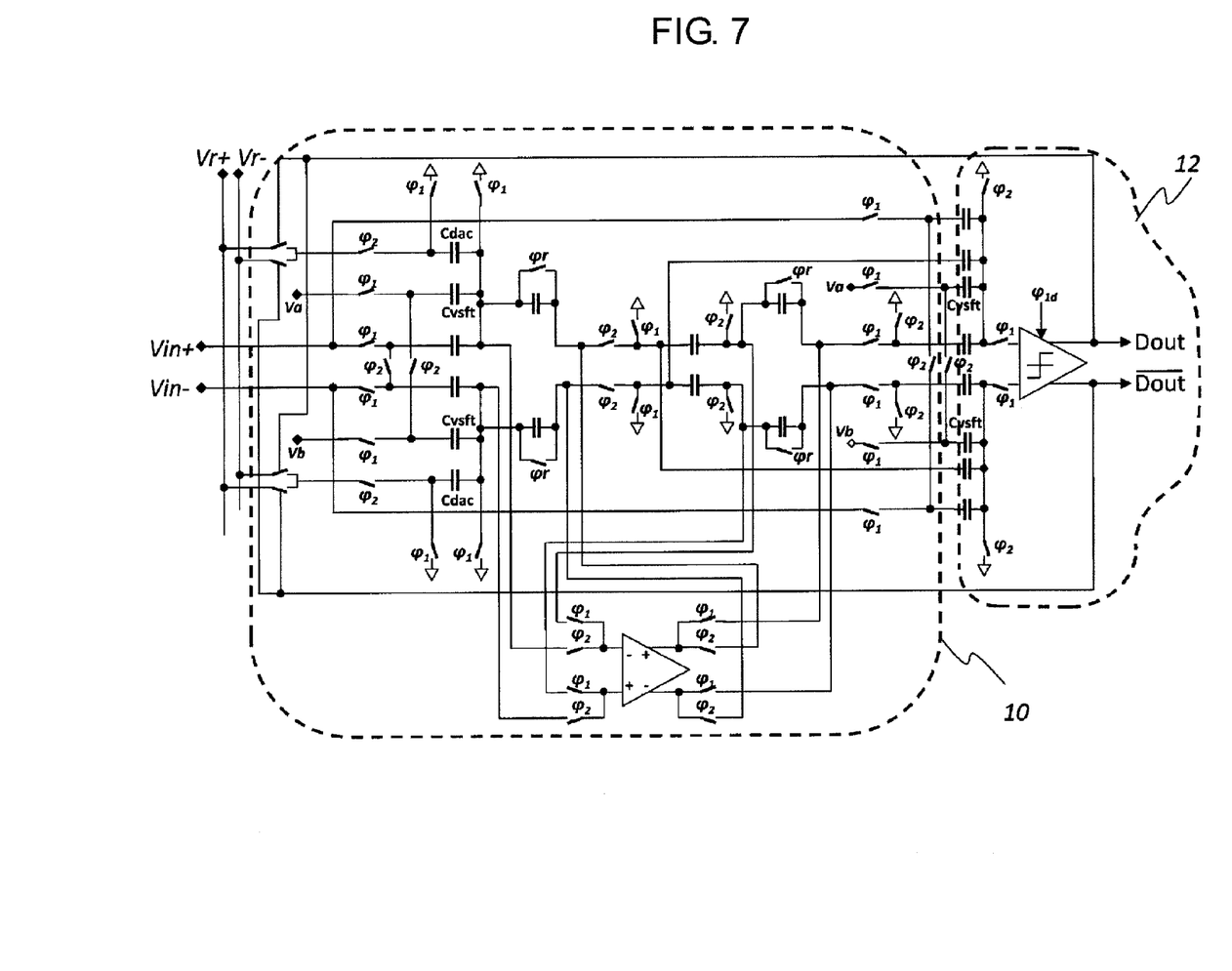
FIG. 7 is a circuit diagram for illustrating another example of the circuit configuration of the second-order delta-sigma modulator of this embodiment.

FIG. 7 is a circuit diagram for illustrating another example of the circuit configuration of the second-order delta-sigma modulator of this embodiment. Transfer characteristics of the second-order delta-sigma modulator are the same as those of the circuit of FIG. 6. In the circuit of FIG. 7, it is assumed that common-mode voltages of the input signals (Vin+ and Vin−) differ from a common-mode voltage of the fully-differential amplifier. Accordingly, a capacitor Cdac is added to the digital/analog converter 5. In addition, when there is an offset between signal ranges of the input signals (Vin+ and Vin−) and a differential range of the fully-differential amplifier, a capacitor Cvsft is added as a circuit configured to shift levels of the input signals (Vin+ and Vin−).

In this manner, even in the case where the common-mode voltages of the input signals (Vin+ and Vin−) differ from the common-mode voltage of the fully-differential amplifier, or the case where there is an offset between the signal ranges of the input signals (Vin+ and Vin−) and the differential range of the fully-differential amplifier, the technical ideas of the present invention can be applied.

As described above, in the delta-sigma modulator of the present invention, the fully-differential amplifier can be shared between the adjacent amplifying/integrating circuits, and hence the circuit scale and the power consumption can be reduced. In addition, the signal delay is reduced, thereby achieving stable operation.

Note that, the delta-sigma modulator of the present invention is described as the second-order or third-order circuit, but the present invention can be similarly applied to circuits with more stages.

What is claimed is:

1. A delta-sigma modulator, comprising:
a first amplifying/integrating circuit comprising:
an adder circuit configured to add together a first signal obtained by amplifying an analog input signal by an expected gain, and a second signal obtained by amplifying a feedback analog signal by an expected gain, to thereby output a first added signal; and
an integrating circuit configured to integrate the first added signal, to thereby output a first integrated signal;
an amplifying/integrating circuit is cascaded in series after the first amplifying/integrating circuit to amplify the first integrated signal by an expected gain to output a respective amplified signal and afterwards integrate the respective amplified signal with a respective integrator to output a respective integrated signal, wherein the amplifying/integrating circuit comprising N stages of amplifying/integrating circuit(s) pair cascaded in series after the first amplifying/integrating circuit, where N is an integer equal to or larger than 1; and
a quantizer configured to compare a magnitude of an expected reference signal with a magnitude of a sum of respective signals from each of: the analog input signal, the amplified first output integrated signal of the first amplifying/integrating circuit and the respective amplified output integrated signal from each of the N stages of the cascaded amplifying/integrating circuit(s) pair, to output a digital value as a compared result,
wherein, of the first amplifying/integrating circuit and the N stages of the cascaded amplifying/integrating circuit(s) pair, amplifying/integrating circuits which are cascaded in series comprise a delay integrating circuit after a first stage amplifier and a non-delay integrating circuit after a subsequent stage amplifier, respectively.

2. The delta-sigma modulator according to claim 1, wherein the integrating circuit of the first amplifying/integrating circuit comprises the delay integrating circuit, and
wherein an integrating circuit of a second amplifying/integrating circuit connected in series to the first amplifying/integrating circuit comprises the non-delay integrating circuit.

3. The delta-sigma modulator according to claim 1, wherein the integrating circuit of the first amplifying/integrating circuit comprises the delay integrating circuit, and
wherein an integrating circuit of a second amplifying/integrating circuit connected in series to the first amplifying/integrating circuit comprises the delay integrating circuit, and
wherein an integrating circuit of a third amplifying/integrating circuit connected in series to the second amplifying/integrating circuit comprises the non-delay integrating circuit.

4. The delta-sigma modulator according to claim 2, wherein the amplifying/integrating circuits each comprise a switched capacitor amplifier, and
wherein the amplifying/integrating circuit comprising the delay integrating circuit and the amplifying/integrating circuit comprising the non-delay integrating circuit are configured to operate the respective switched capacitor amplifiers in a time division manner.

5. The delta-sigma modulator according to claim 4, wherein the switched capacitor amplifiers configured to be operated in the time division manner comprise one switched capacitor amplifier.

6. The delta-sigma modulator according to claim 3, wherein the amplifying/integrating circuits each comprise a switched capacitor amplifier, and
wherein the amplifying/integrating circuit comprising the delay integrating circuit and the amplifying/integrating circuit comprising the non-delay integrating circuit are configured to operate the respective switched capacitor amplifiers in a time division manner.

7. The delta-sigma modulator according to claim 6, wherein the switched capacitor amplifiers configured to be operated in the time division manner comprise one switched capacitor amplifier.

* * * * *